(12) United States Patent
Kang et al.

(10) Patent No.: US 7,041,557 B2
(45) Date of Patent: May 9, 2006

(54) METHOD OF MANUFACTURING A THIN DIELECTRIC LAYER USING A HEAT TREATMENT AND A SEMICONDUCTOR DEVICE FORMED USING THE METHOD

(75) Inventors: Sung-Taeg Kang, Seoul (KR); Jeong-Uk Han, Suwon (KR); Sung-Woo Park, Gunpo (KR); Seung-Beom Yoon, Suwon (KR); Ji-Hoon Park, Seoul (KR); Bo-Young Seo, Aayang (KR)

(73) Assignee: Samsung Electronics, Co., Ltd., (KR)

( * ) Notice: Subject to any disclaimer, the term of this patent is extended or adjusted under 35 U.S.C. 154(b) by 0 days.

(21) Appl. No.: 10/832,952

(22) Filed: Apr. 27, 2004

(65) Prior Publication Data

US 2005/0106897 A1 May 19, 2005

(30) Foreign Application Priority Data

Nov. 14, 2003  (KR)  ...................... 10-2003-0080574

(51) Int. Cl.
*H01L 21/366* (2006.01)

(52) U.S. Cl. ...................... 438/261; 438/216; 438/591; 438/287

(58) Field of Classification Search ...................... None
See application file for complete search history.

(56) References Cited

U.S. PATENT DOCUMENTS

| | | | |
|---|---|---|---|
| 5,600,166 A | 2/1997 | Clementi et al. | 257/324 |
| 6,211,016 B1 | 4/2001 | Wu | 438/264 |
| 6,512,264 B1 | 1/2003 | Ogle, Jr. et al. | 257/324 |
| 6,602,781 B1 * | 8/2003 | Xiang et al. | 438/655 |

(Continued)

FOREIGN PATENT DOCUMENTS

JP  07-045725  2/1995

(Continued)

OTHER PUBLICATIONS

Pan, Tung Ming, et al., "High Quality Interpoly-Oxynitride Grown by $NH_3$ Nitridation and $N_2O$ RTA Treatment," IEEE Electron Device Letters, vol. 22, No. 2, Feb. 2001.

*Primary Examiner*—Chandra Chaudhari
*Assistant Examiner*—Victor V. Yevsikov
(74) *Attorney, Agent, or Firm*—Mills & Onello, LLP

(57) ABSTRACT

In a method for forming a semiconductor device and a semiconductor device formed in accordance with the method, a thin dielectric layer is provided between a lower conductive layer and an upper conductive layer. In one embodiment, the thin dielectric layer comprises an inter-gate dielectric layer, the lower conductive layer comprises a floating gate and the upper dielectric layer comprises a control gate of a transistor, for example, a non-volatile memory cell transistor. The thin dielectric layer is formed using a heat treating process that results in reduction of surface roughness of the underlying floating gate, and results in a thin silicon oxy-nitride layer being formed on the floating gate. In this manner, the thin dielectric layer provides for increased capacitive coupling between the lower floating gate and the upper control gate. This also leads to a lowered programming voltage, erasing voltage and read voltage for the transistor, while maintaining the threshold voltage in a desired range. In addition, the size of the transistor and resulting storage cell can be minimized and the need for a high-voltage region in the circuit is mitigated, since, assuming a lowered programming voltage, pumping circuitry is not required.

40 Claims, 5 Drawing Sheets

U.S. PATENT DOCUMENTS

| | | | |
|---|---|---|---|
| 6,730,992 B1 * | 5/2004 | Sakama et al. | 257/639 |
| 6,828,200 B1 * | 12/2004 | Chambers et al. | 438/287 |
| 2002/0001897 A1 | 1/2002 | Helm et al. | 438/201 |
| 2002/0197777 A1 | 12/2002 | Kim et al. | 438/151 |
| 2003/0171005 A1 * | 9/2003 | Tsujikawa et al. | 438/785 |
| 2004/0005761 A1 * | 1/2004 | Shibata | 438/261 |

FOREIGN PATENT DOCUMENTS

| | | |
|---|---|---|
| KR | 10-1999-004419 | 1/1999 |
| KR | 1020030000663 | 1/2003 |

* cited by examiner

METHOD OF MANUFACTURING A THIN DIELECTRIC LAYER USING A HEAT TREATMENT AND A SEMICONDUCTOR DEVICE FORMED USING THE METHOD

RELATED APPLICATIONS

This application claims priority to Korean Patent Application Serial Number 2003-80574, filed Nov. 14, 2003, the contents of which are incorporated herein by reference, in their entirety.

BACKGROUND OF THE INVENTION

Non-volatile memory devices find widespread application in electronic systems that do not receive continuous power, for example in applications where power is not always available, where power is frequently interrupted, and/or where low-power usage is desired. Example applications include mobile telecommunication systems, memory cards for storing music and/or image data, and system-on-a-chip applications that include a processing unit and a memory unit.

Cell transistors in non-volatile memory devices commonly employ a stacked gate structure that is formed over a channel region of a substrate between source/drain regions. The stacked gate structure includes a sequentially stacked gate insulating layer formed on the channel, floating gate electrode, inter-gate dielectric layer and control gate electrode. The floating gate electrode and the control gate electrode are capacitively coupled to allow for programming of the floating gate during a programming stage of the transistor. At the same time, the floating gate electrode is isolated between the gate insulating layer and the inter-gate dielectric layer to prevent the migration of charge from the floating gate to the substrate or from the floating gate to the control gate during operation of the transistor following the programming stage.

The gate insulating layer is commonly formed of a gate oxide material such as $SiO_2$. The floating gate formed on the gate insulating layer comprises a conductive material such as polysilicon. The inter-gate dielectric layer is formed on the floating gate. A control gate comprising a conductive material such as polysilicon is then formed on the inter-gate dielectric layer. The inter-gate dielectric layer must therefore be sufficiently thin to provide for adequate capacitive coupling between the control gate and the floating gate during the programming stage to allow for charge flow so that charge can be stored in the floating gate. Also, a thin inter-gate dielectric layer results in increased device speed. At the same time, the inter-gate dielectric layer must be sufficiently thick to prevent the migration of charge from the floating gate to the control gate during operation of the transistor following programming.

The stacked gate structure can be reduced schematically to two capacitors in series between a control voltage $V_{control}$ applied to the control gate and a substrate voltage, for example a ground voltage, applied to the substrate. A first capacitance ($C_1$) is provided between the control gate and the floating gate, and a second capcitance ($C_2$) is provided between the floating gate and the substrate. The resulting voltage of the floating gate is therefore determined according to the relationship has the relationship $V_{floating}=V_{control}C_1/(C_1+C_2)$. During a charging operation, a large positive voltage is applied to the control gate relative to the substrate. Electrons migrate from the substrate and penetrate into the floating gate through the gate insulating layer. The floating gate is thus provided with an initial voltage $V_{floating}$. A large first and second capacitance tends to maintain the initial voltage of the floating gate. Conversely, during a discharge operation, a negative voltage is applied to the control gate, and a positive voltage is applied to the substrate. During a discharge operation, the electrons previously stored in the floating gate are released back into the substrate through the gate insulating layer. The amount of charge in the floating gate changes the threshold voltage of the transistor. In this manner, a charged transistor is interpreted as a first binary value, for example, a "1", and a discharged transistor is interpreted as second binary value, for example, a "0", during a read operation of the transistor.

In non-volatile memory devices, the characteristics of the inter-gate dielectric layer used for isolating the floating gate from the control gate are of primary consideration. The inter-gate dielectric layer must be capable of preventing migration of electrical charge from the floating gate to the control gate. For this reason, a thick inter-gate dielectric layer is desired. At the same time, the dielectric layer should be as thin as possible to ensure capacitive coupling between the control gate and floating gate during a programming operation. Floating-gate memory devices commonly require a high programming voltage for carrying out the charge and discharge operations. For example, contemporary flash cells operate in programming mode using an 18 volt potential between the control gate and the substrate. Contemporary electrically erasable programmable read only memory (EEPROM) devices require a 15 volt potential. Specialized pumping circuits are used to generate such a high voltage on the chip, and specialized high-voltage transistors are required for applying the high voltage to the device terminals. Such large-scale components tend to consume valuable chip surface area, and tend to raise the manufacturing costs.

Some have proposed formation of the inter-gate dielectric layer entirely of $SiO_2$, or "oxide". However, if oxide is used alone as the inter-gate dielectric, it must be formed in a layer of at least 150 Å in thickness for preventing migration of charge from the floating gate to the control gate and to prevent the surface roughness of the underlying polysilicon floating gate from transferring to the floating gate. Such a thick layer requires an excessively high programming voltage to ensure capacitive coupling between the control gate and the floating gate.

Others have proposed an inter-gate dielectric layer formed of silicon nitride $SiN_3$, or "nitride". A nitride inter-gate dielectric layer provides for enhanced capacitive coupling between the control gate and the floating gate, per unit of thickness, as compared to an oxide inter-gate dielectric layer. However, nitride does not adhere well to the polysilicon material in the control gate and floating gate and therefore is impractical for use alone as an inter-gate dielectric material.

In view of this, others have proposed a layered combination of oxide-nitride-oxide (ONO) layers for forming the inter-gate dielectric layer. In an ONO layer, the beneficial capacitive coupling effects of the nitride layer are realized, while the lower and upper oxide layers provide for a transition, or buffer layer, between the nitride dielectric layer and the polysilicon control gate and floating gate. However, in this configuration, due to the surface roughness of the floating gate which is at least 40 Å in height, the lower oxide layer in contact with the floating gate must be formed to a thickness of at least 60 Å in order to adequately cover the underlying topology. Since the lower oxide layer has conforming characteristics, the topology of the underlying top surface of floating gate is translated to the upper surface of the lower oxide layer This is followed by a nitride layer of 80 Å in thickness. Since the nitride layer also has conforming characteristics, the topology of the underlying top surface of oxide layer is translated to the upper surface of the nitride layer. A second oxide layer of 60 Å in thickness is then deposited on the nitride layer. This layer, referred to as a blocking oxide layer, prevents diffusion of charge between the floating gate and the control gate. The resulting structure is thus 190 Å in thickness, which limits the amount to which the programming voltage of the device can be lowered.

SUMMARY OF THE INVENTION

The present invention is directed to a method for forming a semiconductor device and a semiconductor device formed in accordance with the method in which a thin dielectric layer is provided between a lower conductive layer and an upper conductive layer.

In one embodiment, the thin dielectric layer comprises an inter-gate dielectric layer, the lower conductive layer comprises a floating gate and the upper dielectric layer comprises a control gate of a transistor, for example, a non-volatile memory cell transistor. In this manner, the thin dielectric layer provides for increased capacitive coupling between the lower floating gate and the upper control gate. This also leads to a lowered programming voltage, erasing voltage and read voltage for the transistor, while maintaining the threshold voltage in a desired range. In addition, the size of the transistor and resulting storage cell can be minimized and the need for a high-voltage region in the circuit is mitigated, since, assuming a lowered programming voltage, pumping circuitry is not required.

The thin dielectric layer is formed using a heat treatment process that results in a reduction of surface roughness of the underlying floating gate and results in a thin silicon oxy-nitride layer being formed on the floating gate. A dielectric layer is formed on the silicon oxy-nitride layer, and the combined layers form an inter-gate dielectric layer. The resulting thin dielectric layer is an excellent barrier to charge migration from the floating gate.

In a first aspect, the present invention is directed to a method of forming an inter-conductor dielectric layer between first and second conductive layers. A first conductive layer is provided. The first conductive layer is first heat-treated in an atmosphere of a first gas including silicon and hydrogen and a second gas including nitrogen. Following the first heat treatment, the first conductive layer is second heat-treated in an atmosphere of a third gas including nitrogen. A dielectric layer is provided on the first conductive layer following the second heat treatment. A second conductive layer is provided on the dielectric layer.

In one embodiment, the first heat treatment is performed at a temperature at a range between about 700 C and 800 C, for example at a range between about 700 C and 750 C. In another embodiment, the first heat treatment is performed at a temperature of about 730 C for a duration of about 1 hour, or at a temperature of about 800 C for a duration of about 30 minutes.

In one embodiment, the first gas is silane, and is selected from the group consisting of: $SiH_4$, $SiH_2$, $Si(CH_3)H_3$, and $Si_3H_8$. The second gas is selected from the group consisting of: $NH_3$ and $N_2$. The third gas optionally further includes oxygen, and for example is selected from the group consisting of: $N_2O$ and NO.

In one embodiment, the first heat treatment improves surface roughness in an upper surface of the first conductive layer. The second heat treatment provides an oxy-nitride interface on the first conductive layer. The oxy-nitride interface comprises, for example, silicon oxy-nitride $SiO_xN_y$ material, and is less than about 20 Å in thickness. In one embodiment, the combined thickness of the oxy-nitride interface and the dielectric layer is less than about 70 Å in thickness.

In one embodiment, the dielectric layer is formed of a material selected from the group consisting of oxide, nitride, and oxy-nitride. In another embodiment, forming the dielectric layer comprises forming a first dielectric layer on the first conductive layer following the second heat treatment, and forming a second dielectric layer on the first dielectric layer, in which case, the first dielectric layer comprises nitride and wherein the second dielectric layer comprises oxide.

In one embodiment, the first and second conductive layers comprise polysilicon. In one embodiment, the first conductive layer comprises a floating gate formed on a semiconductor substrate, and the second conductive layer comprises a control gate formed on the dielectric layer.

In another aspect, the present invention is directed to a method of forming an inter-gate dielectric layer between a floating gate and a control gate of a semiconductor device. A gate insulating layer is formed on a semiconductor substrate. A floating gate layer is formed on the gate insulating layer. The floating gate layer is first heat treated in an atmosphere of a first gas including silicon and hydrogen and a second gas including nitrogen. Following the first heat treatment, the floating gate layer is second heat treated in an atmosphere of a third gas including nitrogen. A dielectric layer is provided on the floating gate layer following the second heat treatment. A control gate layer is provided on the dielectric layer. The gate insulating layer, floating gate layer, dielectric layer and control gate layer are patterned to form a gate structure on the substrate.

In another aspect, the present invention is directed to a semiconductor device. The semiconductor device includes a semiconductor substrate, and a gate dielectric layer on the substrate. A floating gate is on the gate dielectric layer. An oxy-nitride interface layer is on the floating gate of a thickness less than about 20 Å. A dielectric layer is on the interface layer. A control gate is on the second dielectric layer.

In one embodiment, the interface layer is of a thickness less than about 10 Å.

In one embodiment, the interface layer is formed by: first heat treating the floating gate in an atmosphere of a first gas including silicon and hydrogen and a second gas including nitrogen; and following the first heat treatment, second heat treating the floating gate in an atmosphere of a third gas including nitrogen.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1A:
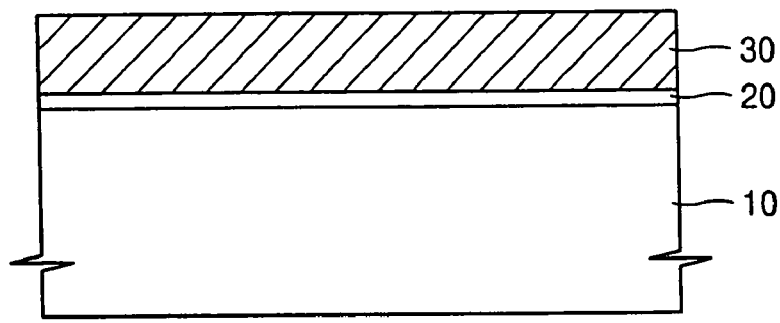
FIGS. 1A–1F are cross-sectional views of the fabrication process of a semiconductor device in accordance with an embodiment of the present invention.

In the following description of preferred embodiments of the present invention and in the claims that follow, the term "on", when referring to layers of material used in the fabrication of semiconductor devices, refers to a layer that is directly applied to an underlying layer, or refers to a layer that is above an underlying layer with an optional intermediate layer or layers therebetween. The thicknesses of the respective layers are not necessarily to scale in the drawings, but instead are exaggerated for clarity and to illustrate the various features of the present invention.

FIGS. 1A–1F are cross-sectional views of the fabrication of a semiconductor device in accordance with an embodiment of the present invention.

In FIG. 1A, a gate insulating layer 20 is formed to a thickness of 100 Å on a semiconductor substrate 10. In one embodiment, the semiconductor substrate comprises silicon material and the gate insulating layer comprises $SiO_2$, or "oxide".

A first conductive layer 30 is then formed on the gate insulating layer 20. In one embodiment, the conductive layer comprises polysilicon having a thickness of 1500 Å formed by a chemical vapor deposition (CVD) process. In one embodiment, the first conductive layer 30 is later patterned to form a floating gate, as will be described below. The upper surface of the first conductive layer 30 has a substantial surface roughness at this time due to the material characteristics of the polysilicon, and due to the deposition process used for forming the layer 30. For example, as described above, the surface roughness of the first conductive layer is on the order of at lease 40 Å in height.

Figure 1B:
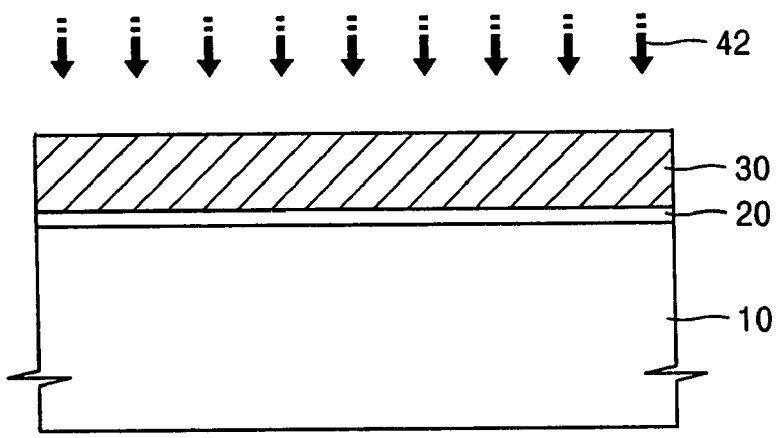

In FIG. 1B, a first heat treatment 42 is applied to the resulting structure. The first heat treatment reduces the surface roughness of the polysilicon layer 30. The first heat treatment 42 is applied by placing the substrate in a furnace chamber that is heated to a temperature in the range of 650 C to 850 C. The chamber is subjected to a flow of a first gas including silicon and hydrogen, and a flow of a second gas including nitrogen. In one embodiment, the first gas comprises silane $SiH_4$ and the second gas comprises ammonia $NH_3$. The ratio of the second gas including nitrogen to the first gas including hydrogen and silicon is on the order of between 10:1 and 1000:1. At a ratio less than 10:1, for example at a ratio of 9:1, silicon lumps are generated in the polysilicon. The first gas including silicon and hydrogen may optionally comprise other forms of silane, for example, $SiH_2$, $Si(CH_3)H_3$, or $Si_3H_8$, or combinations thereof. The second gas may optionally comprise $N_2$ gas.

In one embodiment, the first heat treatment 42 is applied at a temperature of 730 C for 1 hour. In other embodiments, the first heat treatment may be applied at 800–850 C for 30 minutes. The vacuum condition for the chamber is less than 0.5 torr, for example, 0.3 torr.

As a result of the first heat treatment 42, the surface roughness of the polysilicon layer 30 is reduced, for example, to less than 30 Å. The use of a gas that includes silicon and hydrogen, such as silane, during the first heat treatment provides for a marked improvement in surface roughness of the underlying polysilicon layer. At the same time, the use of silane allows for the process temperature to be lowered below 800 C and allows for a reduction in process time. The amount of silane should be limited, however, since excessive silane can cause undesirable silicon lumps to be formed in the polysilicon layer.

Figure 4A:
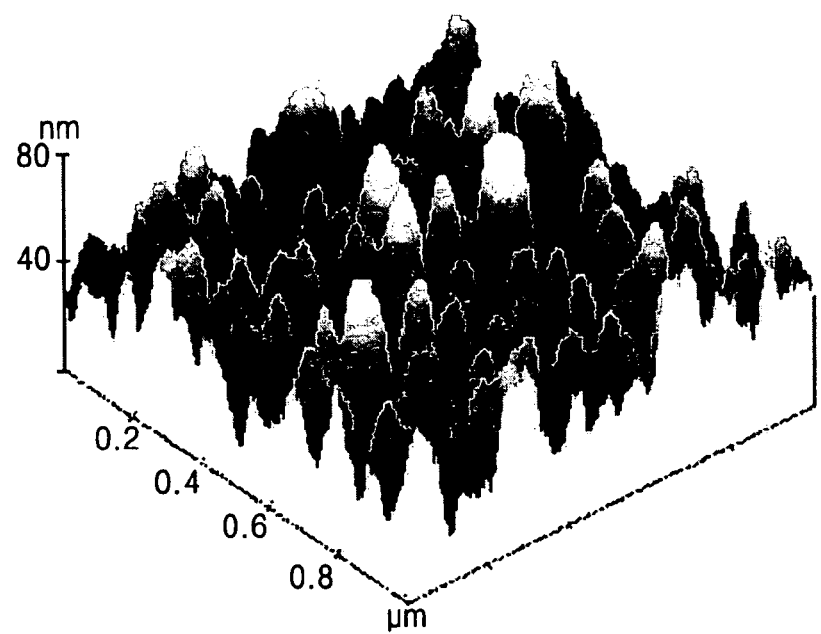
FIGS. 4A and 4B are perspective views of the surface roughness of the upper surface of a floating gate according to the process of the conventional approach and according to the process of the present invention, respectively.
Figure 4B:
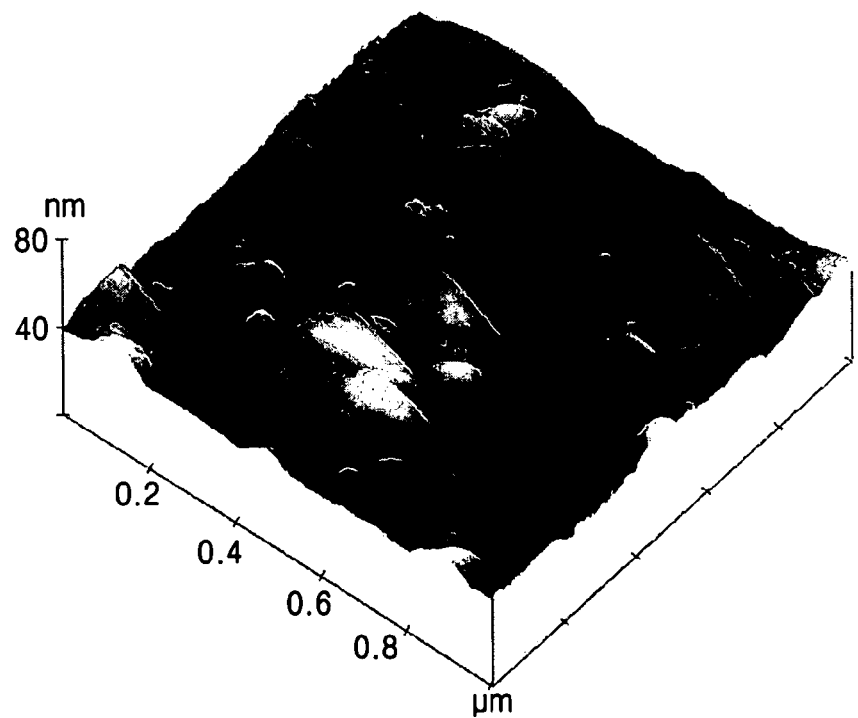

A comparative example of the resulting surface roughness is illustrated in FIGS. 4A and 4B. FIG. 4A is a perspective view of the surface roughness of the upper surface of a floating gate formed according to the conventional approach and following an oxide deposition. The resultant upper surface of the floating gate has a high degree of surface roughness, for example on the order of at least 40 Å. FIG. 4B is a perspective view of the surface roughness of the upper surface of a floating gate application of the first heat treatment 42. The resultant upper surface of the floating gate following the first heat treatment has a relatively low surface roughness, for example on the order of less than 30 Å.

Figure 1C:
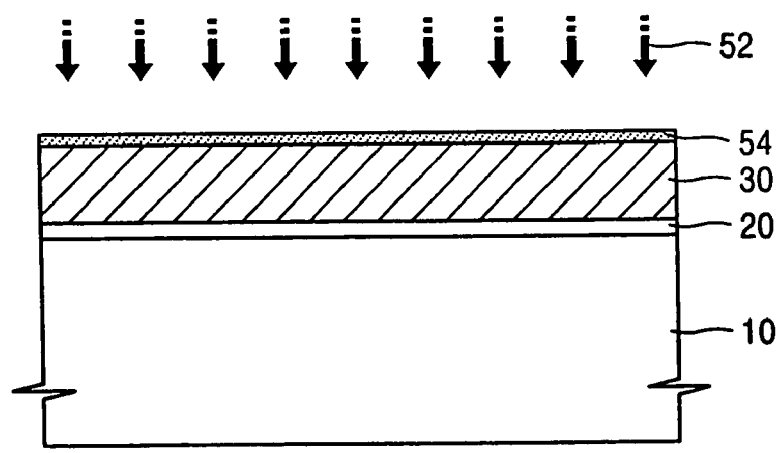

In FIG. 1C, a second heat treatment 52 is applied to the resulting structure. The second heat treatment 52 is applied in the furnace chamber that is heated to a temperature in the range of 800 C to 850 C and that is provided with a flow of a third gas including nitrogen, such as $N_2O$ or NO gas. In one embodiment, the second heat treatment is applied at a temperature of 800 to 850 C for 30 minutes to 1 hour.

As a result of the second heat treatment, an oxy-nitride layer 54 is formed on the polysilicon layer 30 as a result of the substitution of dangling bonds in the underlying structure. As mentioned above, this oxy-nitride layer 54 is formed on the upper surface of the polysilicon layer 30 having reduced surface roughness as a result of the first heat treatment. In one embodiment, the oxy-nitride layer 54 comprises silicon oxy-nitride $SiO_xN_y$, material, formed at a thickness on the order of about 10 Å on the upper surface of the polysilicon layer. The oxy-nitride layer 54 is an excellent barrier to the migration of stored charge from the floating gate formed of the polysilicon layer 30 to the upper control gate. At the same time, the oxy-nitride layer 54 is thin, for example less than about 10 Å in thickness, and therefore provides for superior capacitive coupling between the floating gate and the control gate. The enhanced capacitive coupling, in turn, allows for the resulting transistor to operate at a reduced programming voltage, erase voltage and read voltage, while maintaining a predictable threshold voltage.

Figure 1D:
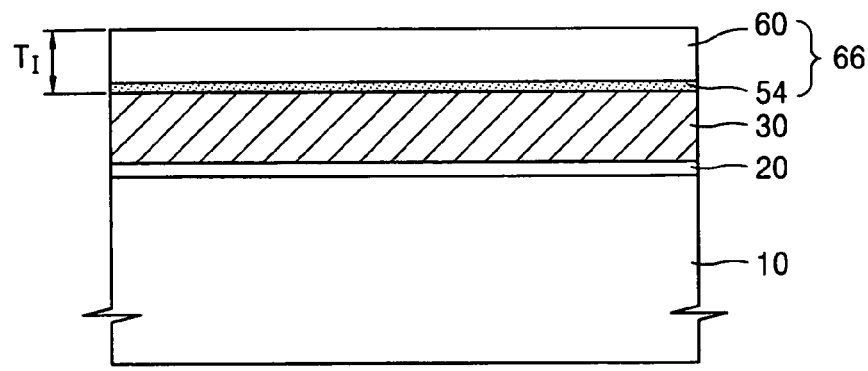

In FIG. 1D, a dielectric layer 60 is formed to a thickness of between 50 and 100 Å on the resulting structure. In one embodiment, the dielectric layer comprises $SiO_2$, and is formed using CVD. Together, the lower oxy-nitride layer 54 and upper dielectric layer 60 form the inter-gate dielectric layer 66. The combined thickness $T_I$ of the inter-gate dielectric layer is on the order of 60 to 100 Å in thickness, which is relatively thin as compared to the resulting inter-gate dielectric layers of the conventional approaches, which are typically greater than 150 Å in thickness.

Figure 1E:
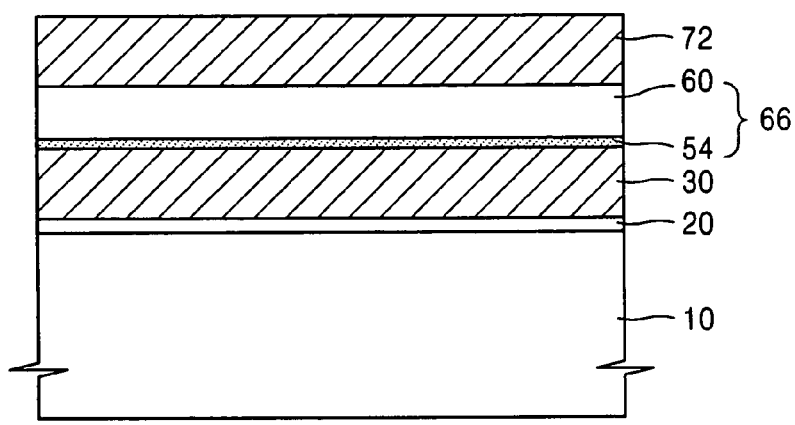

In FIG. 1E, a second conductive layer 72 is formed on the inter-gate dielectric layer 66. In one embodiment, the second conductive layer 72 comprises polysilicon having a thickness on the order of about of 1500 Å formed by a chemical vapor deposition (CVD) process. The second conductive layer 72 is later patterned to form a control gate.

Figure 1F:
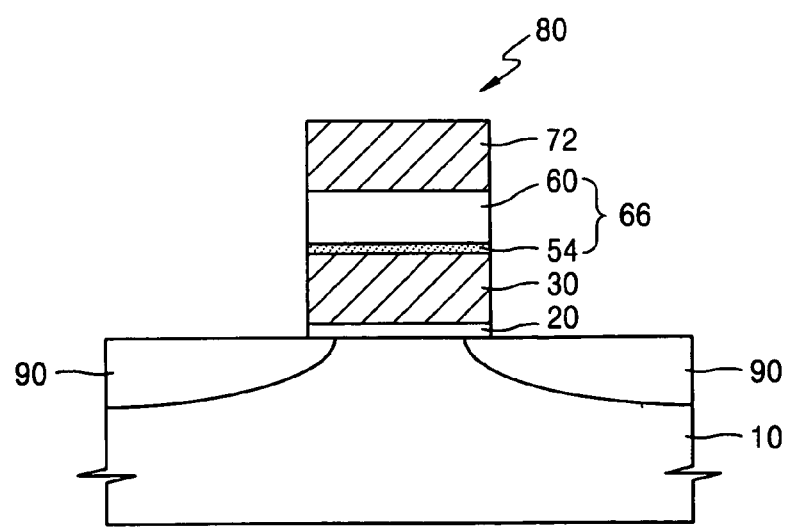

In FIG. 1F, the resulting structure is patterned using conventional photolithography processes to form a gate pattern 80 that serves as a gate for a resulting transistor. Ion implantation of impurities produces source/drain regions 90 on sides of the gate structure. Lateral spacers may be formed on sides of the gate structure, according to conventional means.

Figure 2A:
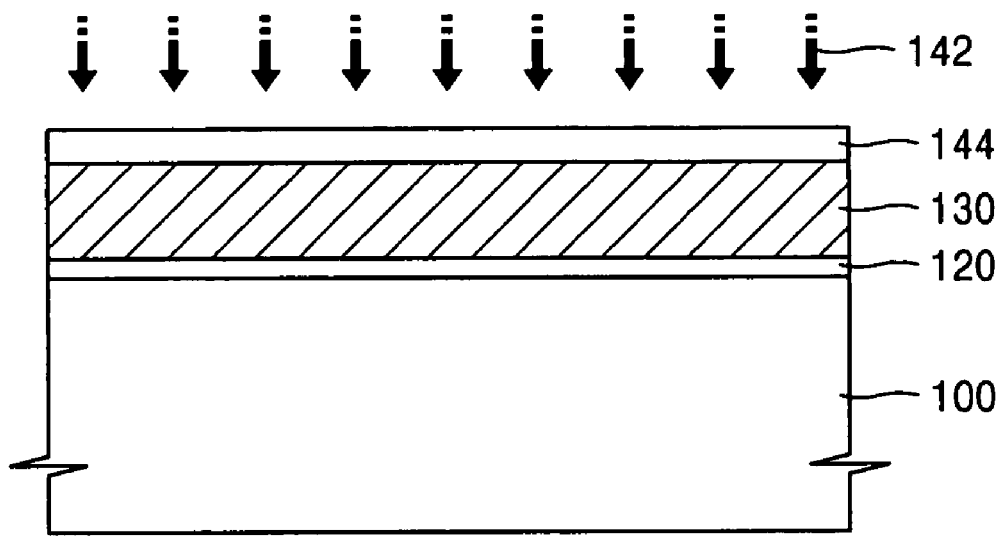
FIGS. 2A–2C are cross-sectional views of the fabrication of a semiconductor device in accordance with another embodiment of the present invention.
Figure 2B:
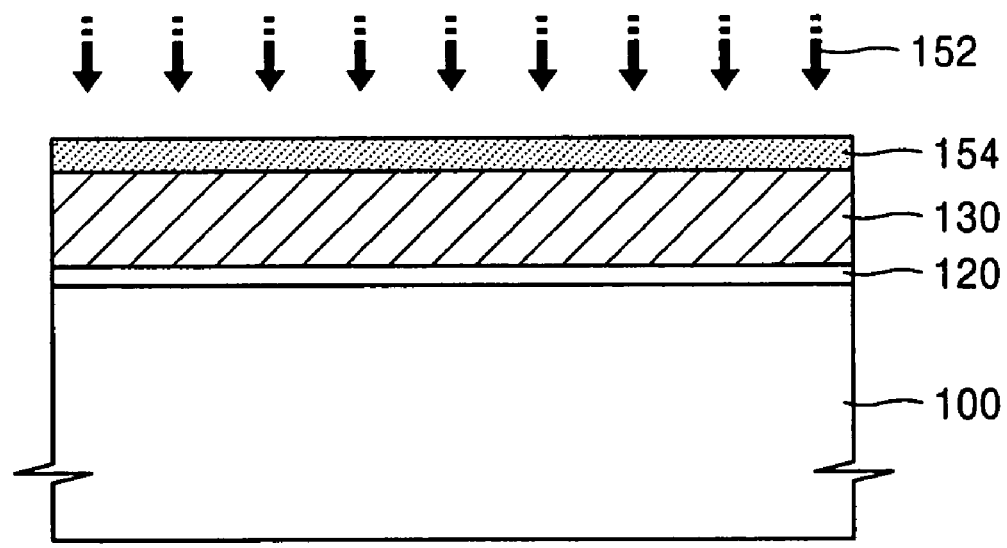
Figure 2C:
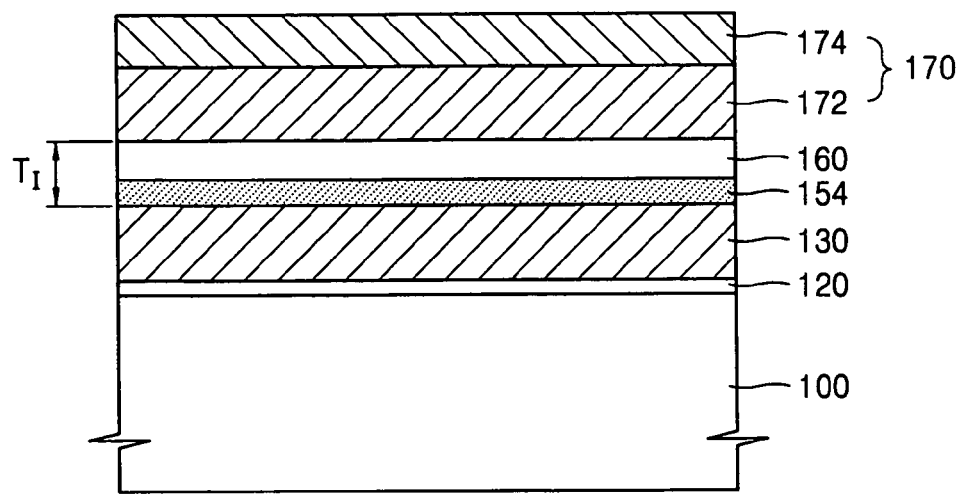

FIGS. 2A–2C are cross-sectional views of the fabrication of a semiconductor device in accordance with another embodiment of the present invention.

Figure 3:
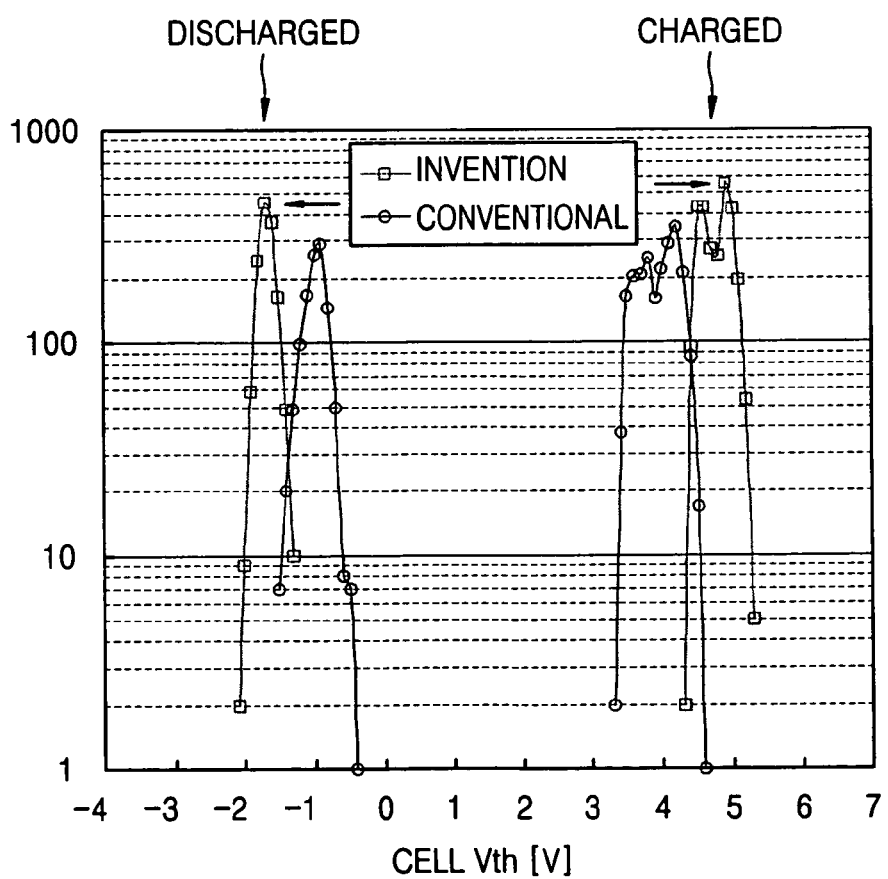
FIG. 3 is an exemplary chart of threshold voltage of a semiconductor device fabricated in accordance with the present invention, as compared to a semiconductor device fabricated according to conventional means.

FIG. 3 is a chart that illustrates the threshold voltage for charged and discharged states of a semiconductor device formed according to the process of the present invention, as compared to the threshold voltage of a semiconductor device formed according to the conventional approach. The thin inter-gate dielectric layer of the present invention improves capacitive coupling between the floating gate and control gate, as described above. Thus, during a charge or discharge operation, the amount of carriers moved is increased, as compared to conventional embodiments. As a result, in the present invention, the threshold voltage of the "on" cell is decreased, and the threshold voltage of an 'off' cell is increased, as compared to conventional embodiments. When the same amount of voltage is required to charge or discharge, a lower threshold voltage than the conventional cell is sufficient to charge and discharge the cell.

While this invention has been particularly shown and described with references to preferred embodiments thereof, it will be understood by those skilled in the art that various changes in form and details may be made herein without departing from the spirit and scope of the invention as defined by the appended claims.

We claim:

1. A method of forming an inter-conductor dielectric layer between first and second conductive layers comprising:
   providing a first conductive layer;
   first heat treating the first conductive layer in an atmosphere of a first gas including silicon and hydrogen and a second gas including nitrogen;
   following the first heat treatment, second heat treating the first conductive layer in an atmosphere of a third gas including nitrogen;
   providing a dielectric layer on the first conductive layer following the second heat treatment; and
   providing a second conductive layer on the dielectric layer.

2. The method of claim 1 wherein the first heat treatment is performed at a temperature at a range between about 700 C and 800 C.

3. The method of claim 1 wherein the first heat treatment is performed at a temperature at a range between about 700 C and 750 C.

4. The method of claim 1 wherein the first heat treatment is performed at a temperature of about 730 C for a duration of about 1 hour.

5. The method of claim 1 wherein the first heat treatment is performed at a temperature of about 800 C for a duration of about 30 minutes.

6. The method of claim 1 wherein the first gas is silane.

7. The method of claim 1 wherein the first gas is selected from the group consisting of: $SiH_4$, $SiH_2$, $Si(CH_3)H_3$, and $Si_3H_8$.

8. The method of claim 1 wherein the second gas is selected from the group consisting of: $NH_3$ and $N_2$.

9. The method of claim 1 wherein the third gas further includes oxygen.

10. The method of claim 1 wherein the third gas is selected from the group consisting of: $N_2O$ and NO.

11. The method of claim 1 wherein the first heat treatment improves surface roughness in an upper surface of the first conductive layer.

12. The method of claim 1 wherein the wherein the second heat treatment provides an oxy-nitride interface on the first conductive layer.

13. The method of claim 12 wherein the oxy-nitride interface comprises silicon oxy-nitride $SiO_xN_y$ material.

14. The method of claim 12 wherein the oxy-nitride interface is less than about 20 Å in thickness.

15. The method of claim 12 wherein a combined thickness of the oxy-nitride interface and the dielectric layer is less than about 70 Å in thickness.

16. The method of claim 1 wherein the dielectric layer is formed of a material selected from the group consisting of oxide, nitride, and oxy-nitride.

17. The method of claim 1 wherein forming the dielectric layer comprises forming a first dielectric layer on the first conductive layer following the second heat treatment, and forming a second dielectric layer on the first dielectric layer.

18. The method of claim 17 wherein the first dielectric layer comprises nitride and wherein the second dielectric layer comprises oxide.

19. The method of claim 1 wherein the first and second conductive layers comprise polysilicon.

20. The method of claim 1 wherein the first conductive layer comprises a floating gate formed on a semiconductor substrate, and wherein the second conductive layer comprises a control gate formed on the dielectric layer.

21. A method of forming an inter-gate dielectric layer between a floating gate and a control gate of a semiconductor device comprising:
   providing a gate insulating layer on a semiconductor substrate;
   providing a floating gate layer on the gate insulating layer;
   first heat treating the floating gate layer in an atmosphere of a first gas including silicon and hydrogen and a second gas including nitrogen;
   following the first heat treatment, second heat treating the floating gate layer in an atmosphere of a third gas including nitrogen;
   providing a dielectric layer on the floating gate layer following the second heat treatment;
   providing a control gate layer on the dielectric layer; and
   patterning the gate insulating layer, floating gate layer, dielectric layer and control gate layer to form a gate structure on the substrate.

22. The method of claim 21 further comprising forming source and drain regions in the substrate adjacent the gate structure.

23. The method of claim 21 wherein the first heat treatment is performed at a temperature at a range between about 700 C and 800 C.

24. The method of claim 21 wherein the first heat treatment is performed at a temperature at a range between about 700 C and 750 C.

25. The method of claim 21 wherein the first heat treatment is performed at a temperature of about 730 C for a duration of about 1 hour.

26. The method of claim 21 wherein the first heat treatment is performed at a temperature of about 800 C for a duration of about 30 minutes.

27. The method of claim 21 wherein the first gas is silane.

28. The method of claim 21 wherein the first gas is selected from the group consisting of: $SiH_4$, $SiH_2$, $Si(CH_3)H_3$, and $Si_3H_8$.

29. The method of claim 21 wherein the second gas is selected from the group consisting of: $NH_3$ and $N_2$.

30. The method of claim 21 wherein the third gas further includes oxygen.

31. The method of claim 21 wherein the third gas is selected from the group consisting of: $N_2O$ and $NO$.

32. The method of claim 21 wherein the first heat treatment improves surface roughness in an upper surface of the floating gate layer.

33. The method of claim 21 wherein the wherein the second heat treatment provides an oxy-nitride interface on the floating gate layer.

34. The method of claim 33 wherein the oxy-nitride interface comprises silicon oxy-nitride $SiO_xN_y$ material.

35. The method of claim 33 wherein the oxy-nitride interface is less than about 20 Å in thickness.

36. The method of claim 33 wherein a combined thickness of the oxy-nitride interface and the dielectric layer is less than about 70 Å in thickness.

37. The method of claim 21 wherein the dielectric layer is formed of a material selected from the group consisting of oxide, nitride, and oxy-nitride.

38. The method of claim 21 wherein forming the dielectric layer comprises forming a first dielectric layer on the floating gate layer following the second heat treatment, and forming a second dielectric layer on the first dielectric layer.

39. The method of claim 38 wherein the first dielectric layer comprises nitride and wherein the second dielectric layer comprises oxide.

40. The method of claim 21 wherein the first and second conductive layers comprise polysilicon.

* * * * *